United States Patent [19]

McKenny et al.

[11] 4,125,854

[45] Nov. 14, 1978

[54] SYMMETRICAL CELL LAYOUT FOR STATIC RAM

[75] Inventors: Vernon G. McKenny; Tsiu C. Chan, both of Carrollton, Tex.

[73] Assignee: Mostek Corporation, Carrollton, Tex.

[21] Appl. No.: 746,665

[22] Filed: Dec. 2, 1976

[51] Int. Cl.$^2$ ............................................. H01L 27/02
[52] U.S. Cl. ........................................ 357/41; 357/45; 357/59; 307/303; 307/304; 307/238; 365/174; 365/182
[58] Field of Search .............................. 357/41, 45, 59; 307/303, 304, 238; 340/173 CA, 173 TC, 173 R; 365/174, 182

[56] References Cited

U.S. PATENT DOCUMENTS

| | | | |
|---|---|---|---|
| 3,703,710 | 11/1972 | Kubo | 340/173 FF |
| 3,757,313 | 9/1973 | Hines | 340/173 R |
| 3,798,621 | 3/1974 | Baitinger | 340/173 R |
| 3,893,087 | 7/1975 | Baker | 340/173 R |
| 3,967,252 | 6/1976 | Donnelly | 340/173 R |
| 3,980,507 | 9/1976 | Carley | 148/187 |

Primary Examiner—Martin H. Edlow
Attorney, Agent, or Firm—James J. Mullen

[57] ABSTRACT

A symmetrical structural layout for the principal components of each cell in a group of four mutually contiguous cells of an array of memory cells is disclosed. A common drain supply node is centrally disposed within the group and is coincident with the intersection of first and second mutually perpendicular axes of symmetry. Corresponding components of contiguous cells in each row and column are symmetrically disposed with respect to each of the first and second axes of symmetry. In a preferred embodiment, the principal components of each cell include a plurality of insulated gate field-effect transistors each having a source diffusion region and a drain diffusion region formed within the substrate and a plurality of impedance devices electrically connecting the common drain supply node to the drain diffusions of the transistors in each cell. The impedance devices extend radially from the common drain supply node into the interior of each cell, and at least one of the diffused regions of each transistor in each cell is formed in common with a diffused region of a transistor of a contiguous cell.

11 Claims, 7 Drawing Figures

SYMMETRICAL CELL LAYOUT FOR STATIC RAM

CROSS REFERENCE TO RELATED APPLICATION

The present application is a continuation-in-part of application Ser. No. 743,816, entitled "Extremely Low Current Load Device For Integrated Circuit", filed Nov. 22, 1976. The present application incorporates by reference all of the features described in that copending application which was filed by V.G. McKenny an T.C. Chan, and assigned to the same assignee of the present invention.

BACKGROUND OF THE INVENTION

1. Field of the Invention

The present invention is concerned with random access memories of the type fabricated on a monolithic semiconductor chip using insulated gate semiconductor field-effect transistor technology, and more particularly relates to an improved structural layout for the principal components of each cell of an integrated circuit memory.

2. DESCRIPTION OF THE PRIOR ART

Large scale integration (LSI) techniques have brought about the construction of large arrays of binary storage elements on a single chip of silicon. These storage cells, typically using MOS technology, consist of multi-component circuits in a conventional bistable configuration. The immediate advantages of such semiconductor storage devices are the high packing density and low power requirements. The insulated gate MOS transistor has been particularly exploited in this application area since it requires less substrate area (thereby increasing the packing density) and operates at very low power levels.

A well known memory cell circuit arrangement which utilizes insulated gate MOS field-effect transistors is the cross-coupled inverter stage as disclosed in U.S. Pat. No. 3,967,252. In that arrangement the gates of a pair of insulated gate MOS field-effect transistors are cross coupled to a true data mode and a complementary data node. Binary information stored within the cell is maintained by impedance means which are connected to the data nodes to maintain the potential at the gate of the transistors at a predetermined level which corresponds to the logic content of the cell. In the static random access memory cells shown in U.S. Pat. No. 3,967,252, there are two cross-coupled inverters comprising two load devices and four transistors. In an effort to minimize the substrate area required for a given number of memory cells, the two load devices in the static cell of each inverter have been fabricated as an integral portion of a polycrystalline silicon strip which interconnects a common drain supply node to a data node as disclosed and claimed in the above identified co-pending application.

There remains considerable interest in minimizing the dimensions of the cell structure of integrated circuit memories to provide improve performance and higher packing density. One prior art approach for minimizing the dimensions of a conventional cross-coupled inverter stage is illustrated in FIG. 7 of the drawing. In that arrangement, shared diffusion regions interconnect the principal components of the cell to corresponding components of adjacent cells in the same row or in the same column. Also, a pair of cells in a single column are energized from a common drain supply node. It is an object of the present invention to provide an improved structural layout for the principal components of each cell so that the shared diffusion regions and the common power supply nodes may be utilized more efficiently.

SUMMARY OF THE INVENTION

A further reduction in the physical size of a memory cell for an integrated circuit memory can be accomplished by organizing the principal components in a symmetrical arrangement wherein a common drain supply node is centrally disposed with respect to a group of four mutually contiguous cells and in which shared diffusion regions are utilized to provide a common source supply node for four mutually contiguous cells of adjacent groups of cells. Each group of contiguous cells is characterized by first and second mutually perpendicular axes of symmetry. Corresponding components of adjacent cells in each group are symmetrically disposed with respect to each of the principal axes of symmetry. By this symmetrical arrangement, the structural layout of the principal components of any two contiguous cells of the same row or of the same column appear to be the mirror image of the principal components in the remaining two cells of the contiguous group. Additional groups of four mutually contiguous cells are arrayed in pairs of rows and pairs of columns to complete the integrated circuit memory. Adjacent groups are linked together by a shared diffision region which interconnects the source diffusion region of a data storage transistor in each of four mutually contiguous cells thereby defining a common source supply node for those cells.

The novel features which characterize the invention are defined by the appended claims. The foregoing and other objects, advantages and features of the invention will hereinafter appear, and for purposes of illustration of the invention, but not of limitation, an exemplary embodiment of the invention is shown in the appended drawing.

DETAILED DESCRIPTION

In the description which follows, the present invention is described in combination with a random access memory of the type utilizing insulated gate field-effect transistor technology. The structure as disclosed herein may be fabricated on a single semiconductor chip and is primarily intended for such fabrication.

Figure 1:
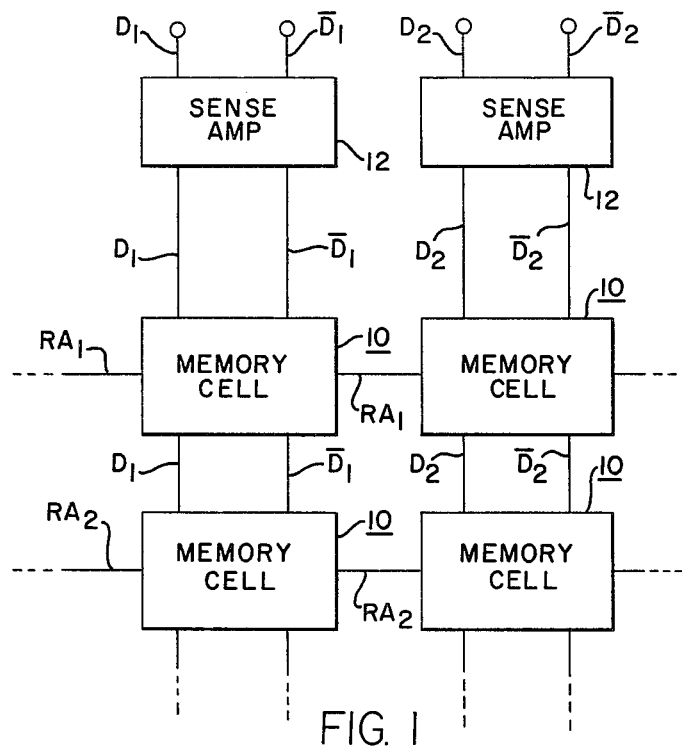
FIG. 1 is a block circuit diagram of a portion of a random access memory which utilizes a memory cell constructed according to the teachings of the present invention.
Figure 2:
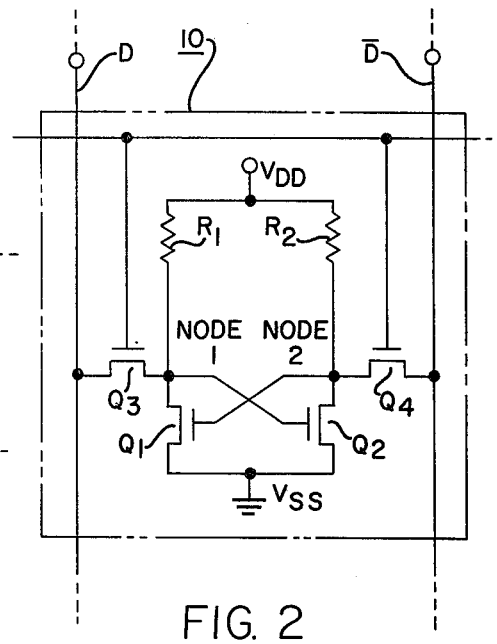
FIG. 2 is an electrical circuit diagram of the memory cell shown in FIG. 1.

Referring now to FIG. 1 and FIG. 2 of the drawing, a portion of a random access memory which utilizes circuitry constructed according to the teachings of the present invention is illustrated. In FIG. 1, a portion of a random access memory includes a plurality of static memory cells 10 which are part of an array of many such cells arranged in rows and columns in the conventional manner. The memory cells 10 are disposed in separate columns and accordingly connected to separate complementary data buses $D_1$, $\overline{D}_1$ and $D_2$, $\overline{D}_2$. Since the memory cells are disposed in separate rows, the rows are addressed or enabled by separate row address lines $RA_1$ and $RA_2$, respectively. The row address line $RA_1$ enables all the memory cells in one row while address line $RA_2$ enables all the memory cells in a second row. A sense amplifier and level shifter is indicated generally by the reference numeral 12 and is connected to the output of each of the columns. The sense amp 12 may be of any conventional type, for example, that which is disclosed and claimed by U.S. Pat. No. 3,967,252. Write control circuits (not shown) may be connected to drive the column buses during a write cycle in the conventional manner. Column enable means (not shown) may be provided to connect different pairs of column buses to a single sense amp, or a separate sense amp may be provided for each pair of column buses.

An electrical schematic diagram of the memory cell 10 is illustrated in FIG. 2 of the drawing. The binary memory cell 10 comprises first and second complementary data input-output nodes 1,2 which provide a direct current impedance path and a relatively higher direct current impedance path corresponding to each binary logic state. First and second impedance means, $R_1$ and $R_2$, electrically connect a drain supply node $V_{DD}$ to the first and second data nodes 1,2 respectively. The structure of the impedance means $R_1$ and $R_2$ is described in detail in the above identified co-pending application, which application is hereby incorporated by reference. The memory cell 10 also includes a pair of cross-coupled insulated gate field-effect data storage transistors $Q_1$ and $Q_2$. The data nodes 1,2 are cross coupled by the gates of the transistors $Q_1$ and $Q_2$, respectively, and are connected by enabling transistors $Q_3$ and $Q_4$ to the column buses D and $\overline{D}$, respectively. The gates of the enabling transistors $Q_3$ and $Q_4$ are connected to the corresponding row address line $RA_1$. The channel between the drain and source terminals of transistors $Q_1$ and $Q_2$ electrically connect each data node 1, 2 to a source power supply node $V_{SS}$ when conducting.

To understand the operation of the circuit of FIG. 2, assume that the row address line $RA_1$ is low (logic "0") so that the enabling transistors $Q_3$ and $Q_4$ of the memory cell 10 which are connected to the row address line $RA_1$ are turned off. This allows the column buses D and $\overline{D}$ to assume a voltage level of $V_{DD}$ less one threshold in this implementation because there are no current paths to the source voltage $V_{SS}$. In a typical circuit, $V_{DD}$ may be 5 volts and the threshold may be about 2.5 volts, in which case the column buses D and $\overline{D}$ would be about 2.5 volts. In other implementations, D and $\overline{D}$ may assume voltage levels as high as $V_{DD}$ or as low as slightly more than one threshold above $V_{SS}$. In this state, no current will flow through the column buses D and $\overline{D}$ because each is in an open circuit in the absence of a current path through an enabled cell. As a result the data output nodes 1,2 are at a voltage substantially equal to $V_{DD}$ or $V_{SS}$, respectively, from the nodes 1,2 to $V_{SS}$.

Assume that a logic "0" has been stored in the memory cell 10 so that the transistor $Q_1$ is turned on and data node 1 is substantially at $V_{SS}$, and that transistor $Q_2$ is turned off and the data node 2 is substantially at $V_{DD}$. Then when the row address line $RA_1$ goes high, that is, is charged to a bias potential corresponding to a logic "1", the memory cell 10 is enabled as the transistors $Q_3$, $Q_4$ turn on. This results in a current path to $V_{SS}$ through the transistor $Q_1$ and $Q_3$ and the column bus D. The transistor $Q_2$ is turned off so that no current path is established from the column bus D to ground. As a result, the data node 2 remains substantially at $V_{DD}$ or 5 volts. If, on the other hand, a logic "1" is stored in the address of memory cell 10, the transistor $Q_1$ is turned off and transistor $Q_2$ is turned on. Current through $Q_2$ and $Q_4$ then causes the bus D to decrease from about five volts to a lower level while the voltage of the column bus $\overline{D}$ and data node 1 remain at the percentage level of 5 volts.

It will be noted that the data output nodes 1,2 swing between $V_{DD}$ and $V_{SS}$ depending upon the logic content of the cell. These voltages levels must be maintained to preserve the logic content of the cell 10. In the memory cell 10, these reference potentials are maintained at the data nodes 1,2 by the load impedance devices $R_1$ and $R_2$ which connect the data nodes to the drain supply node $V_{DD}$.

Figure 3:
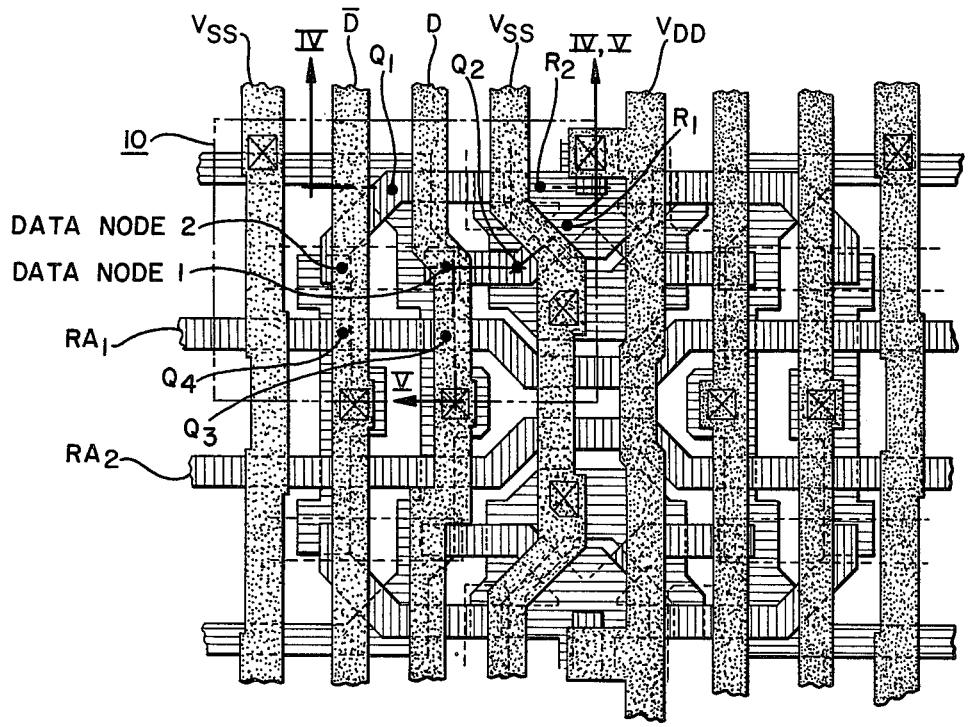
FIG. 3 is a substrate layout diagram of the circuit shown in FIG. 2.
Figure 4:
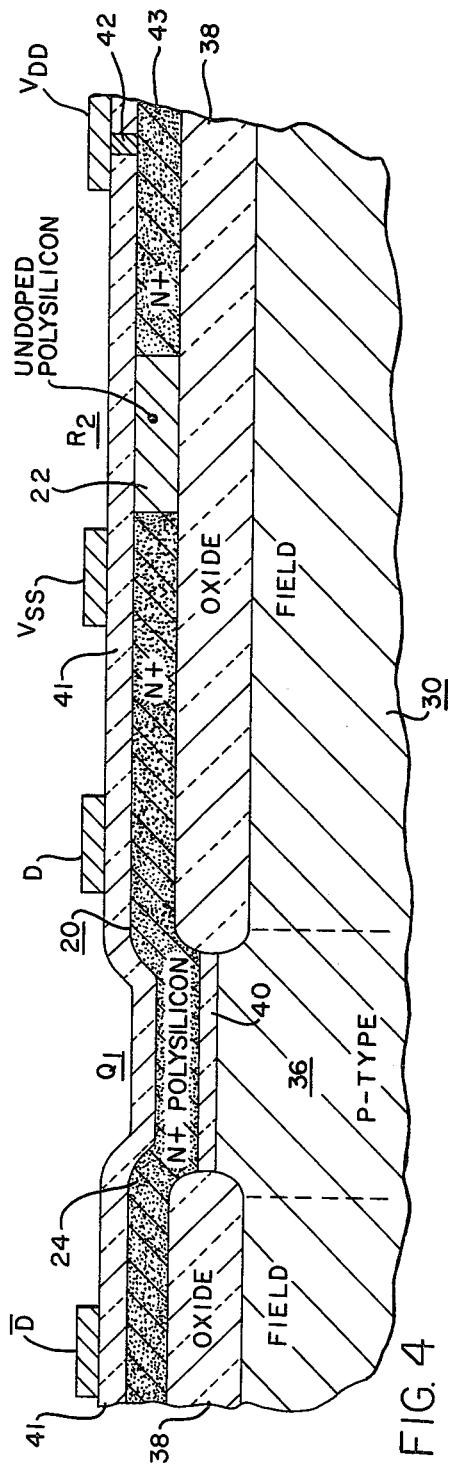
FIG. 4 is an elevation view, in section, taken along the line IV—IV of FIG. 3.

Referring now to FIGS. 3 and 4 of the drawing, a substrate layout of the memory cell 10 is illustrated. Each of the load impedance devices $R_1$ and $R_2$ include a body 20 of substantially pure intrinsic semiconductor material defining a first conductive path and a diffusion of extrinsic conductivity impurities disposed within a region of the intrinsic body 20 defining a second conductive path 24. An intrinsic-extrinsic junction 28 is defined by the interface of the extrinsic diffusion path 24 and the undiffused intrinsic path 22. The intrinsic path 22 and the extrinsic path 24 define a series electrical path from the drain supply node $V_{DD}$ to the corresponding data node 1,2. As used herein, the phrase "intrinsic semiconductor material" means elemental semiconductor material which is undoped and which has not been diffused or otherwise implanted with impurities.

The memory cell 10 is disposed upon a substrate 30 of an extrinsic semiconductor material of a first conductivity type, for example, P-type monocystalline silicon. Each of the field-effect transistors $Q_1$-$Q_4$ include a source region 32 and a drain region 34 (FIG. 5) in which impurities of the opposite conductivity type, for example N-type, have been diffused and extend substantially parallel to each other in the conventional manner through an active region 36 of the substrate 30. A layer 38 of field insulation is disposed over the surface of the substrate 30 and is formed in a relatively thin layer 40 in the gate zone which lies directly over the active region 36. The diffused polysilicon layer 24 serves as a gate interconnect portion for the transistor formed over the active region. A layer 41 of electrical insulation, preferably oxide, is formed over the field oxide 38 and over the gate oxide 40 and gate strip 24.

The semiconductor material which forms the conductive layer 20 is of the same elemental semiconductor type as is the substrate 30, and is preferably constructed of a continuous layer of polycrystalline silicon. The extrinsic impurities diffused within the layer 20 may be either N-type or P-type. In a preferred embodiment, the extrinsic impurities diffused into the layer 20 are of the opposite conductivity type relative to the conductivity type of the substrate 30. For example, for a P-type substrate 30, the impurities diffused into the layer 20 are N-type, so that the diffusion of the gate strip 24, source and drain regions 32, 34, and impedance devices $R_1$ and $R_2$ may all be formed during a single diffusion step of an isoplanar silicon gate process.

The drain supply node $V_{DD}$ may comprise a metallization deposit 42 which is bonded directly to a diffused gate interconnect portion 43, or in some instances the metallization deposit 42 may be bonded directly to the substantially pure intrinsic region 22. In either configuration, the substrate surface area utilized for the impedance load device $R_2$ is extremely small with the width of the gate interconnect portion 24 being typically 5 microns and the length of the intrinsic undoped conductive path 22 being typically 8 microns. An intrinsic-extrinsic junction device constructed with these dimensions may exhibit as much as 1,000 megohms impedance to the flow of direct current.

Figure 6:
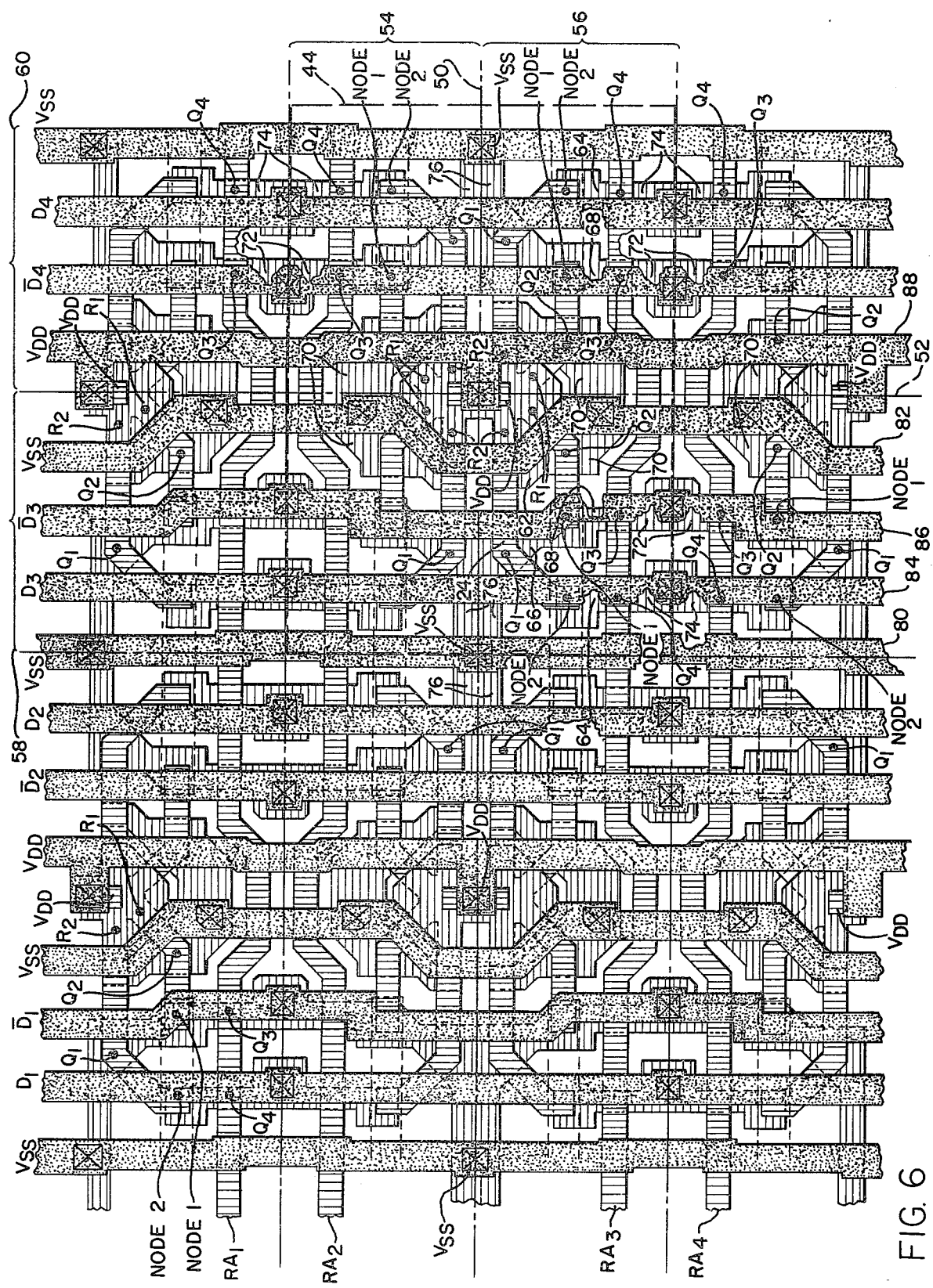
FIG. 6 is a partial substrate layout diagram which illustrates the symmetrical organization of groups of cells within the memory shown in FIG. 1 of the drawing; and, FIG. 7 is a partial substrate layout diagram of a prior art memory cell arrangement.
Figure 7:
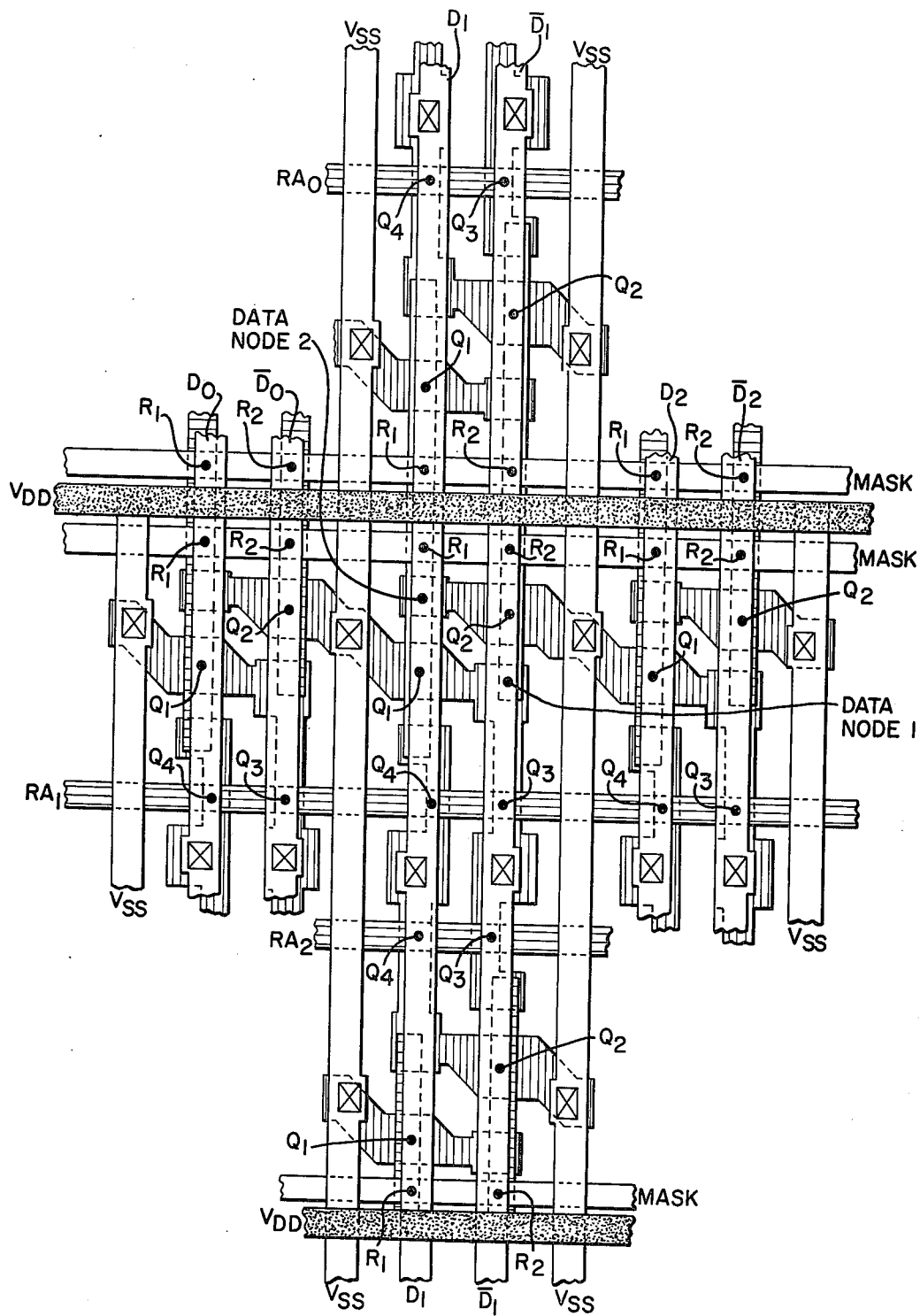

According to the teachings of the present invention, the principal components of each cell, that is, the insulated gate field-effect transistors $Q_1$–$Q_4$ and $R_1$, $R_2$ in a selected group 44 of four mutually contiguous cells are symmetrically organized about a first axis of symmetry 50 and a second axis of symmetry 52 which extends perpendicular to the axis 50 as shown in FIG. 6 of the drawing. The selected group 44 of four mutually contiguous cells are disposed in a first row 54 and a second row 56 and in a first column 58 and in a second column 60, with identical groups being located in neighboring pairs of adjacent rows and columns. The drain supply node $V_{DD}$ is disposed substantially in the geometrical center of the group 44 and is coincident with the intersection of the first and second axes of symmetry 50, 52. The first and second impedance devices $R_1$, $R_2$ of each cell extend radially from the common drain supply node $V_{DD}$ to the interior of the associated cell.

The gate 24 of the data storage transistor $Q_1$ is electrically connected to the drain diffusion 62 of the data storage transistor $Q_2$, to the drain diffusion 64 of the enabling transistor $Q_4$, and to the impedance device $R_2$ thereby defining data node 2 for each cell. The gate of data storage transistor $Q_2$ is electrically connected to the drain diffusion 66 of data storage transistor $Q_1$, to the drain diffusion 68 of the enabling transistor $Q_3$, and to the impedance device $R_1$ thereby defining data node 1 for each cell of the array. The drain diffusion 66 of data storage transistor $Q_1$ is formed in common with the drain diffusion 68 of the enabling transistor $Q_3$ in each cell.

The source diffusion 70 of the data storage transistor $Q_2$ in adjacent cells in each row are formed in common with each other. The source diffusions 72,74 of the enabling transistors $Q_3$ and $Q_4$ of each cell in the columns 58,60 and in the row 56 are formed in common with the source diffusions 72,74 of the enabling transistors $Q_3$ and $Q_4$ of corresponding cells of a contiguous group of cells which is located in the columns 58,60 and in the row immediately succeeding row 56. Likewise, the source diffusions of the enabling transistors $Q_3$ and $Q_4$ of the remaining two cells of the group 44 are formed in common with the source diffusions 72,74 of the enabling transistors $Q_3$ and $Q_4$ of corresponding cells of the contiguous group of cells located in columns 58,60 and in the row immediately preceding row 54.

According to an important feature of the invention, the source diffusions 76 of the data storage transistors $Q_1$ of adjacent cells of rows 54,56 and of column 58 are formed in common with the source diffusions 76 of the data storage transistors $Q_1$ of corresponding cells of a group of four mutually contiguous cells located in the rows 54, 56 and in the column immediately preceding column 58, thereby defining a common source supply node $V_{SS}$ for the transistors of the four mutually contiguous cells. Likewise, the source diffusion 76 of the data storage transistors $Q_1$ of the remaining two cells of the group are formed in common with each other and with the source diffusions 76 of data storage transistors $Q_1$ located in contiguous cells in the column immediately succeeding column 60.

The gates of the enabling transistors $Q_3$ and $Q_4$ of each cell located in row 56 are formed in common with each other thereby defining the row address line $RA_3$. The gates of the enabling transistors in the remaining rows of the array are similarly formed by a continuous diffused polycrystalline silicon strip to form a common row address line for each row of the array.

Figure 5:
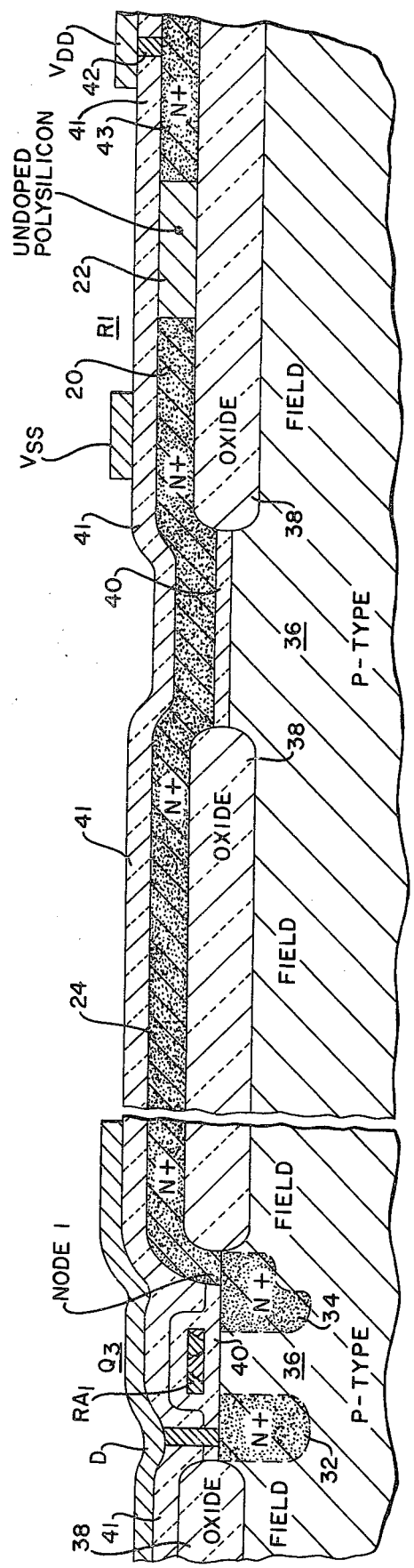
FIG. 5 is an elevation view, in section, taken along the line V—V of FIG. 3.

The diffused regions of each cell and the polycrystalline silicon strips are covered by the insulating oxide layer 41 as shown in FIG. 5 of the drawing. Metallization deposits are formed over the insulating layer 41 to form common conductive lines for $V_{SS}$, D, D, and $V_{DD}$. The metallization deposits extend generally transversely with respect to the row address lines and are insulated from the conductive polycrystalline silicon strips by the insulating layer 41. A first conductive strip 80 is electrically connected to the common source diffusions 76 of the data storage transistors $Q_1$ which are disposed in adjacent columns of contiguous groups thereby defining a first source supply line $V_{SS}$ for each pair of adjacent columns of groups in the array. A second conductive strip 82 is electrically connected to the common source diffusion region 70 of the data storage transistors $Q_2$ of row adjacent cells in each group thereby defining a second source supply line $V_{SS}$ which is common to each cell in a column of such groups. Third and fourth conductive strips 84,86 also extend transversely with respect to the row address lines and are electrically connected to the common source diffusions 72,74 of the enabling transistors $Q_3$, $Q_4$ respectively in each column of cells thereby defining the data lines D, D. A fifth conductive strip 88 also extends transversely with respect to the common row address lines accross each row of cells and is electrically connected to the common drain supply node $V_{DD}$ of each group thereby defining a common drain supply line for each column of groups.

It will be apparent to those skilled in the art that a substantial reduction in cell area is provided by the symmetrical layout of the principal components of each cell as described in the foregoing description of a preferred embodiment of the invention. In particular, a substantial reduction is obtained by forming a common source supply node with the source diffusion regions of insulated gate field-effect transistors in a group of four mutually contiguous cells by forming a common drain supply node for a group of four mutually contiguous cells, and by organizing the principal components of each cell symmetrically with respect to mutually perpendicular axes.

Although a preferred embodiment of the invention has been described in detail, it should be understood that various changes, substitutions, and alterations can be made therein without departing from the spirit and scope of the invention as defined by the appended claims.

What is claimed is:

1. An integrated circuit memory comprising:
   a substrate of semiconductor material of a first conductivity type;
   an array of memory cells fabricated on the substrate in rows and columns;
   each cell of the array including first and second data storage transistors, first and second enabling transistors, and first and second impedance devices, each of the transistors having a gate, a source diffusion region, and a drain diffusion region formed in the substrate;
   the gate of the second data storage transistor being electrically connected to the drain diffusion of the first data storage transistor, to the drain diffusion of the first enabling transistor, and to the first impedance device thereby defining a first data node in each cell of the array;
   the gate of the first data storage transistor being electrically connected to the drain diffusion of the second data storage transistor, to the drain diffusion of the second enabling transistor, and to the second impedance device thereby defining a second data node in each cell of the array;
   the drain diffusion of the first data storage transistor being formed in common with the drain diffusion of the first enabling transistor of each cell of the array;
   the array including a first group of four of the cells disposed in mutual contiguous relation to each other in a first row and in a second row adjacent to the first row, and in a first column and in a second column adjacent to the first column,
   the source diffusions of the second data storage transistors of contiguous cells in the first and second rows of the first group being formed in common, respectively; and,
   the first and second impedance devices of each cell of the first group being electrically connected together to form a drain supply node common to each cell of the group.

2. The integrated circuit memory as defined in claim 1 wherein the common drain supply node is disposed substantially in the geometrical center of the first group of cells, the first and second impedance devices of each cell extending radially from the common drain supply node to the interior of the cell.

3. The integrated circuit memory as defined in claim 2 wherein each of the first and second impedance means of each cell is formed as an integral portion of a polycrystalline silicon strip which interconnects the common drain supply node to the corresponding first and second data nodes, respectively, each impedance means including a body of substantially pure polycrystalline silicon defining a first conductive path and a diffusion of impurities of the opposite conductivity type disposed within a region of the body defining a second conductive path, a diffused-nondiffused junction being defined by the interface of the diffused region with the substantially pure polycrystalline silicon body, the first and second paths defining a series electrical path from the common drain supply node to the corresponding data node.

4. The integrated circuit memory as defined in claim 1, the array including an additional group of four mutually contiguous cells identical to the first group contiguously disposed in the first and second rows and in the first and second columns on each side of the first group;
   the source diffusions of the first and second enabling transistors of each cell in the first and second columns and first row of the first group being formed in common with the source diffusions of the first and second enabling transistors of corresponding cells of the contiguous group of cells disposed in the first and second columns and in the row immediately preceding the first row;
   the source diffusion of the first and second enabling transistors of each cell in the first and second columns and second row of the first group being formed in common with the source diffusions of the first and second enabling transistors of corresponding cells of the contiguous group of cells disposed in the first and second columns and in the row immediately succeeding the second row;
   the source diffusions of the first data storage transistors of the adjacent cells of the first group disposed in the first and second rows and in the first column being formed in common, respectively, with the source diffusions of the first data storage transistors of corresponding cells of the contiguous group of cells disposed in the first and second rows and in the column immediately preceding the first column of the first group;
   the source diffusions of the first data storage transistors of the adjacent cells of the first group disposed in the first and second rows and in the second column being formed in common, respectively, with the source diffusions of the first data storage transistors of corresponding cells of the contiguous group of cells disposed in the first and second rows and in the column immediately succeeding the second column of the first group;
   the gates of the first and second transistors of each cell of the first group disposed in the first row being formed in common with each other and with the gates of the corresponding enabling transistors disposed in the first row of the contiguous groups immediately preceding and succeeding the first group thereby defining a first row address line common to each cell in the first row of the array; and,
   the gates of the first and second enabling transistors of each cell of the first group disposed in the second row being formed in common with each other and with the gates of the corresponding enabling transistors disposed in the second row of the contiguous groups immediately preceding and succeeding the first group thereby defining a second row address line common to each cell in the second row of the array.

5. The integrated circuit memory as defined in claim 4 including:
   a first conductive strip extending transversely with respect to the common row address lines across each row of cells, the first conductive strip being electrically connected to the common source diffusions of the first data storage transistors disposed in adjacent columns of contiguous groups thereby defining a first source supply line for each pair of contiguous columns of groups,
   a second conductive strip extending transversely with respect to the common row address lines across each row of cells, the second conductive strip being electrically connected to the common source diffusions of the second data storage transistors in each group thereby defining a second source supply line for each column of groups;

a third conductive strip extending transversely with respect to the common row address lines across each row of cells, the third conductive strip being electrically connected to the common drain supply node of each group in a column thereby defining a common drain supply line for each column of groups;

a fourth conductive strip extending transversely with respect to the common row address lines across each row of cells, the fourth conductive strip being electrically connected to the first data node of each cell of each column thereby defining a first data output line common to each cell of each column; and, a fifth conductive strip extending transversely with respect to the common row address lines across each row of cells, the fifth conductive strip being electrically connected to the second data node of each cell of each column thereby defining a second data output line common to each cell of each column.

6. In an integrated circuit memory of the type including an array of memory cells fabricated on a semiconductor subtrate in rows and columns, each cell including principal components interconnected to store bits of binary data, an improved structural layout for the principal components of each cell in a group of four mutually contiguous cells of the array comprising:

a common drain supply node disposed substantially in the geometrical center of the group as defined by the intersection of a first centerline axis and a second centerline axis disposed substantially perpendicular to the first axis; and, corresponding component of contiguous cells in each row of the group being symmetrically disposed with respect to each of the first and second axes.

7. The combination as defined in claim 6 wherein each cell includes as principal components a plurality of insulated gate field-effect transistors each having a source diffusion and a drain diffusion formed in the substrate, at least one of the diffused regions of each transistor being formed in common with a diffused region of another transistor of a contiguous cell.

8. The combination as defined in claim 7, including first and second insulated gate field-effect data storage transistors and first and second insulated gate field-effect enabling transistors, the source diffusions of the first data storage transistors of column contiguous cells being formed in common, the source diffusions of the second data storage transistors of row contiguous cells being formed in common, and the drain diffusions of the first data storage transistor and the first enabling transistor being formed in common in each cell.

9. The combination as defined in claim 8, wherein the gate of the first data storage transistor is electrically connected to the drain diffusion of the second enabling transistor and to the drain diffusion of the second data storage transistor thereby defining a first data node, the gate of the second data storage transistor being electrically connected to the drain diffusion of the first enabling transistor and to the drain diffusion of the first data storage transistor thereby defining a second data node, the combination further including first and second impedance devices in each cell of the group of four mutually contiguous cells, each of the impedance devices electrically connecting the common drain supply node to the first and second data nodes, respectively, of each cell.

10. The combination as defined in claim 9 wherein each impedance device extends radially from the common drain supply node, at least one impedance device of each cell being angularly displaced with respect to each of the axes by an angle measuring less than a right angle.

11. An integrated circuit memory comprising:

a substrate of semiconductor material doped with impurities of a first conductivity type;

an array of memory cells fabricated on the substrate in input rows and output columns;

the substrate within each cell of the array including first and second pairs of active surface areas surrounded by a substrate field area, the first pair being the situs of first and second data storage transistors, and the second pair being the situs of first and second enabling transistors;

a strip of gate insulating material disposed over a portion of each active situs area;

a diffusion of impurities of the opposite conductivity type disposed in the substrate beneath each active surface area on either side of the gate insulating strip thereby forming source and drain diffusion regions for each transistor, a nondiffused channel region being defined in the active substrate area beneath the gate insulating strip and between the source and drain diffusion regions, the source and drain diffusion regions of each transistor extending through the surrounding field regions of the substrate for predetermined distances;

a first layer of electrical insulating material being disposed over the substrate field area of each cell and around but not over the active situs areas of each cell;

a conductive gate strip deposited on each gate insulating strip, the conductive gate strips extending transversely with respect to the associated source and drain regions and across the surrounding field insulation;

the conductive gate strips of the first and second enabling transistors of each cell of each input row being formed in common thereby defining a common row address line for each input row;

the source diffusions of the first and second enabling transistors of each cell in a selected row being formed in common with the source diffusions of the first and second enabling transistors of contiguous cells of an adjacent row respectively;

the conductive gate strips of the first and second data storage transistors of each cell extending transversely with respect to the associated diffused source and drain regions across the field insulation and being disposed in electrical contact with the drain diffusions of the second and first enabling transistors, respectively, and in electrical contact with the drain diffusions of the second and first data storage transistors of the same cell, respectively;

first and second impedance means each having a first and second terminal portion, the first terminal portion being electrically connected to the drain diffusions of the first and second data storage transistors of each cell, respectively, thereby defining a first and second data node in each cell, the second terminal portions of the impedance means in each cell of a first group of four mutually contiguous cells being electrically connected together to define a common drain supply node;

the source diffusions of the first data storage transistors of each cell in a second group of four mutually contiguous cells being formed in common thereby defining a first common source supply node, the cells of the second group being disposed in the adjacent rows in which the cells of the first group are disposed, one cell in each row being common to each of the first and second selected groups;

the drain diffusion of the first data storage transistor of each cell being formed in common with the drain diffusion of the first enabling transistor of each cell;

the source diffusion of the second data storage transistor of each cell being formed in common with the source diffusion of the second data storage transistor disposed in the contiguous cell of the same row and adjacent column thereby defining a second source supply node;

a second insulating layer deposited over the first insulating layer, the row address line, gates strips and impedance devices;

a first conductive strip deposited over the second insulating layer and extending transversely with respect to the row address lines across each row of cells, the first conductive strip being electrically connected to each of the first common source supply nodes defined by a plurality of the second groups, the mutually contiguous cells of each of the second groups being disposed in adjacent columns, thereby defining a first source supply line common to each cell in adjacent columns containing the second groups;

a second conductive strip deposited over the second insulating layer and extending across each row of cells substantially parallel to the first conductive strip, the second conductive strip being electrically connected to the common source diffusions of first enabling transistors of contiguous cells in the column thereby defining a common data output line for each of the cells in the column;

a third conductive strip deposited over the second insulating layer and extending across each row of cells substantially parallel to the second conductive strip, the second conductive strip being electrically connected to each of the second data nodes of each cell in the column thereby defining a common data complement output line for each of the cells in the column;

a fourth conductive strip deposited over the second insulating layer and extending across each row of cells of the array and substantially parallel to the third conductive strip, the fourth conductive strip being electrically connected to each of the second source supply nodes of each cell in the column thereby defining a second source supply line common to each cell in the column; and, a fifth conductive strip deposited over the second insulating layer and extending across each row of cells in the column, the fifth conductive strip being electrically connected to each of the common source supply nodes defined by a plurality of the first groups of cells, the mutually contiguous cells of each of the first selected groups being disposed inadjacent pairs of columns, thereby defining a drain supply line common to each cell in adjacent columns containing the first selected groups.

* * * * *

UNITED STATES PATENT AND TRADEMARK OFFICE
CERTIFICATE OF CORRECTION

PATENT NO.   : 4,125,854
DATED   : November 14, 1978
INVENTOR(S) : Vernon G. McKenny and Tsiu C. Chan It is certified that error appears in the above-identified patent and that said Letters Patent is hereby corrected as shown below:

In column 8, claim 4, line 37, after "second" and before "transistors", please insert --enabling--.

Signed and Sealed this

Seventeenth Day of October, 1995

*Attest:*

BRUCE LEHMAN

*Attesting Officer*   *Commissioner of Patents and Trademarks*